United States Patent [19]

Iwanczyk et al.

[11] Patent Number: 4,613,756
[45] Date of Patent: Sep. 23, 1986

[54] MERCURIC IODIDE LIGHT DETECTOR AND RELATED METHOD

[75] Inventors: Jan S. Iwanczyk; Jeff B. Barton, both of Los Angeles; Andrzej J. Dabrowski, Culver City; Wayne F. Schnepple, Santa Barbara, all of Calif.

[73] Assignee: University of Southern California, Los Angeles, Calif.

[21] Appl. No.: 385,420

[22] Filed: Jun. 7, 1982

[51] Int. Cl.$^4$ .............................................. G01T 1/24
[52] U.S. Cl. ............................... 250/361 R; 250/370; 357/30; 357/61
[58] Field of Search .................... 250/370, 390, 363 S, 250/361 R, 363 R; 357/30, 61

[56] References Cited

U.S. PATENT DOCUMENTS

| 4,100,051 | 7/1978 | Kilby et al. | 204/278 |
| 4,291,228 | 9/1981 | Thompson | 250/363 S |
| 4,303,860 | 12/1981 | Bjorkholm et al. | 250/363 S |

OTHER PUBLICATIONS

Swierkowski, "Recent Advances with HgI$_2$ X-Ray Detectors", IEEE Trans. Nucl. Sci., NS-21 (1), 1974, pp. 302-304.
Cho, "Circular Ring Transverse Axial Positron Camera for 3-Dimensional Reconstruction of Radionuclides Distribution", IEEE Trans. Nucl. Sci., NS-23, (1), 2-76, pp. 613-620.
Watt, "Study of Mercuric Iodide Detectors by Pulsed Laser Induced Photoinjection Techniques", IEEE Trans. Nucl. Sci., NS-23 (1), 2-76, pp. 124-130.
Gelbart, "Study of Imperfections in Mercuric Iodide by the Thermally Stimulated Currents Method", IEEE Trans. Nucl. Sci., NS-24, (1), 2-77, pp. 135-141.
Willig, "Large Bandgap Mercury and Lead Compounds for Nuclear Particle Detection", Nucl. Instru. & Methods, 101, 1972, pp. 23-24.
Holzer et al., "Reduction of Polarization in Mercuric Iodide Nuclear Radiation Detectors", IEEE Trans. Nucl. Sci., NS-27 (1), Feb. 1980, pp. 266-271.
Vallerga et al., "A Bismuth Germanate-Shielded Mercuric Iodide X-Ray Detector for Space Applications", IEEE Trans. Nucl. Sci., NS-29 (1) Feb. 1982, pp. 151-154.
Cho et al., "Characterization Effort of HgI$_2$ Radiation Detectors by Pulsed Laser Transient Charge Injection Technique", IEEE Trans. Nucl. Sci., NS-22, Feb. 1975, pp. 229-240.
Tuzzolino et al., "Photoeffects in Silicon Surface-Barrier Diodes", *Journal of Applied Physics*, vol. 33, No. 1, Jan. 1962.
Hoffman et al., "An Analysis of Some of the Physical Aspects of Positron Transaxial Tomography", *Comput Biol Med*, vol. 6, 1976.
Dabrowski et al., "Performance of Room Temp. Mercuric Iodine (HgI$_2$) Detectors in Ultralow-Energy X-Ray Region", IEEE Trans. vol. NS-28, 2-1981.
Iwanczyk et al., "Study of Low-Noise Preamplifier Systems"; IEEE Transactions on Nuclear Science, vol. NS-28, No. 1, Feb. 1981.
Bube, "Opto-Electronic Properties of Mercuric Iodide", *Physical Review*, vol. 106. No. 4, 1957.

*Primary Examiner*—Alfred E. Smith
*Assistant Examiner*—Carolyn E. Fields
*Attorney, Agent, or Firm*—Nilsson, Robbins, Dalgarn, Berliner, Carson & Wurst

[57] ABSTRACT

Apparatus and method for detecting light involve applying a substantially uniform electrical potential difference between first and second spaced surfaces of a body of mercuric iodide, exposing the first surface to light and measuring an electrical current passed through the body in response to the light. The mercuric iodide may be substantially monocrystalline and the potential may be applied between a substantially transparent conductive layer at the first surface and a second conductive layer at the second surface. In a preferred embodiment, the detector is coupled to a scintillator for passage of light to the mercuric iodide in response to ionizing radiation incident on the scintillator.

15 Claims, 7 Drawing Figures

MERCURIC IODIDE LIGHT DETECTOR AND RELATED METHOD

This invention was made with government support under Contract No. DE-AT03-76EV72031 awarded by the U.S. Department of Energy. The U.S. Government has certain rights to this invention.

BACKGROUND OF THE INVENTION

The present invention relates generally to an apparatus and method for detecting light and, more particularly, to a mercuric iodide light detector or "photodetector" which is useful with a scintillator to detect ionizing radiation such as gamma rays, neutrons and charged particles.

Commercially available photomultiplier (PM) tubes have been used to detect and amplify light in a variety of circumstances, including radiation detection. However, radiation detectors using PM tubes for light detection have certain inherent disadvantages. PM tubes are generally rather bulky and cannot be miniaturized beyond a practical minimum size because high voltage dynodes within them must be suitably spaced from each other. The tubes also dissipate substantial power, drawing currents on the order of milliamperes at voltages greater than one kilovolt, and must be used with a power supply capable of delivering the required currents very rapidly.

The relatively large size and high power requirements of PM tubes are dictated by the physical characteristics of the tubes as electron multiplication devices, and limit their effectiveness in many situations. In tomography systems, for example, the physical size of PM tubes severely limits spatial resolution. The high power requirements also limit the resolution of tomography systems and place severe constraints on the design of portable, self-contained radiation detecting instruments.

PM tubes also must be shielded in many applications from magnetic fields, even the naturally occurring magnetic field of the earth, and possess substantially lower quantum efficiency than some solid states devices. The photocathode quantum efficiency of a PM tube is usually less than 30%, as compared with a potential quantum efficiency of close to 100% for solid state photodetectors.

Various solid state photodiodes have been used as light detectors. Existing types include silicon, gallium arsenide and indium phosphide. Such devices generally have objectionably high noise for applications involving low level input signals, due primarily to excessive currents or capacitances.

Silicon photodiodes have been described by Tuzzolino et al. "Photoeffects in Silicon Surface-Barrier Diodes", *Journal of Applied Physics*, Volume 33, No. 1, January 1962. Such diodes commonly have thin transparent contacts of gold or other suitable conductive material and are operated in the reverse-bias mode. They are significantly smaller than PM tubes, however they have leakage currents so large as to limit their performance at room temperature. Silicon photodiodes are therefore inherently noisy in low signal level operation, making it difficult or impossible to obtain a meaningful signal over noise unless the diodes are cooled to very low temperatures.

Scintillation detectors have been formed by combining either PM tubes or silicon photodiodes with scintillators. Ionizing radiation enters the scintillator and interacts with it to produce light photons distributed around a characteristic frequency. This light output is detected by the PM tube or the silicon photodiode. Detectors using PM tubes and scintillators of either sodium iodide (thallium), cesium-iodide (thallium) or bismuth germanate (hereinafter NaI(Tl), CsI(Tl), and BGO, respectively) are available from the Harshaw Chemical Company of Solon, Ohio, as well as other commercial suppliers. They are useful to detect a wide variety of ionizing radiation, including gamma ($\gamma$) radiation, neutron radiation and charged particle radiation.

Scintillation detectors are particularly useful in the field of positron emission tomography (PET) to trace the location and flow of positron-emitting pharmaceuticals within the human body. Information as to location is plotted by computer to yield an image of an organ or blood vessel into which the pharmaceuticals have passed. Positrons emitted by the pharmaceuticals combine almost instantaneously with an electron of the surrounding material to produce two quanta of gamma radiation which travel in opposite directions. Each quantum has an energy of 511 keV, half of the annihilation energy of the positron and electron. The gamma rays are detected by an array of scintillation detectors and the information is computer-analyzed to determine the location of annihilation and thus the location of the positron-emitting material. This technique is thoroughly discussed in Hoffman et al. "An Analysis of Some of the Physical Aspects of Positron Transaxial Tomography", *Comput. Biol. Med.*, Volume 6, pp. 345-360, 1976.

In the technique of PET, the number of detectors and the proximity of the detectors to each other limits the resolution of the image obtainable by computer analysis. The relatively large size of PM tubes therefore severely limits image resolution, as discussed above. On the other hand, silicon photodiodes are unsatisfactory for use in the energy ranges encountered in PET. Such photodiodes generally require a signal of several MeV to yield an output signal above noise at room temperature.

Mercuric iodide has been used by the applicants herein as a detector of low energy x-rays, as described in Dabrowski et al., "Performance of Room Temperature Mercuric Iodide (HgI$_2$) Detectors in the Ultralow-Energy X-Ray Region", *IEEE Transactions on Nuclear Science*, Volume NS-28, No. 1, February 1981. In this context, the wide band gap (2.1 eV) and resultant high electrical resistivity of HgI$_2$ suppresses noise by limiting leakage current to approximately $10^{-12}$ amperes under normal operating conditions. In addition, good electron collection allows construction of a thick, low-capacitance detector. As a result, the signal-to-noise ratio of the detector is relatively high. When used in combination with low noise preamplifiers, including those of the pulsed-light feedback type developed by applicants and disclosed by Iwanczyk et al., "A Study of Low-Noise Preamplifier Systems for Use with Room Temperature Mercuric Iodide (HgI$_2$) X-Ray Detectors", *IEEE Transactions on Nuclear Science*, Volume NS-28, No. 1, February 1981, a useable signal can be obtained over the noise.

In the above-referenced x-ray detectors, the contacts covering the HgI$_2$ are designed for x-ray penetration and not to transmit light. Palladium films thicker than approximately 500 angstroms or thick carbon films have been used for this purpose. In photodetection, however, it is imperative that most of the light incident on the active contact area of the detector be transmitted to the interior of the detector. The thicker contacts used for x-rays are not acceptable. The problem of providing a light transmissive contact is compounded in the case of HgI$_2$ by the fact that it tends to chemically react with many of the materials used to form contacts for silicon photodiodes and other solid state devices.

The photoresponsive properties of HgI$_2$ were disclosed in Bube, "Opto-Electronic Properties of Mercuric Iodide", *Physical Review,* Volume 106, No. 4, 1957. The properties of HgI$_2$ were investigated by Bube using localized graphite contacts on the material. The electrodes themselves were apparently not transparent and established a highly nonuniform potential distribution along the active portion of the material.

SUMMARY OF THE INVENTION

The present invention comprises an apparatus and method for detecting light involving: a body of mercuric iodide defining first and second spaced surfaces, means for producing a substantially uniform electrical potential difference between the first and second surfaces, the potential-producing means being constructed and arranged to admit light to the first surface, and means for measuring current passed between the first and second surfaces in response to light incident on the first surface. In a preferred embodiment, the body of mercuric iodide is substantially monocrystalline and the potential-producing means comprises a substantially transparent conductive layer at the first surface, a second conductive layer at the second surface, means for applying a first potential to the transparent conductive layer, and means for coupling the second conductive layer to a second potential which is positive with respect to the first potential. The substantially transparent conductive layer may be a palladium film approximately 100 angstroms thick. In another embodiment, the measuring means includes a low noise preamplifier connected between the second conductive layer and ground to amplify the electrical current conducted between the first and second surfaces. In a further embodiment, the HgI$_2$ photodetector described above is combined with a scintillator operating in response to ionizing radiation to generate light.

The present invention provides a photodetector which is sensitive to light having a wavelength between approximately 350 and 600 nanometers (nm). The response of the HgI$_2$ detector is suitable for use with the scintillator BGO to form a miniaturized detector sensitive to gamma and charged particle radiation. The wavelength of the light produced by BGO is 480 nm, well within the photoresponsive range of HgI$_2$.

Because HgI$_2$ has a very low leakage current and excellent electron collection characteristics at room temperature, the noise within the material is low even in comparison with very low input signals. It is possible to obtain a meaningful output signal above noise for inputs as small as 300 light photons within the wavelength range of BGO, in contrast to a requirement of approximately 3000 photons in silicon photodetectors. HgI$_2$ absorbs this light very near to its surface, minimizing recombination of the relatively short-lived holes generated in photodetection by collecting them almost immediately at a contact on the irradiated surface.

The output signal of the detector of the present invention can be amplified with the aid of a low noise preamplifier to produce a signal useful in PET or any other application for which PM tubes are used. The small size and high sensitivity of the HgI$_2$/scintillator detector enable it to be used for personal dosimetry and other applications requiring portability. In addition, it should be much less expensive than detectors utilizing PM tubes and is suitable for large scale manufacture. It also operates on a few hundred volts bias across the HgI$_2$ at current levels in the neighborhood of $10^{-12}$ amperes, compared to a required bias of approximately 1000 volts for PM tubes at a current of $10^{-3}$ amperes. Power usage and high voltage requirements thus significantly favor the detectors of the present invention over those involving PM tubes.

Of particular interest is the fact that the HgI$_2$ detector of the present invention is able to produce the desired signal even when used in conjunction with BGO, a scintillator material having a relatively low light output. This is important because BGO not only has good absorption characteristics in the range of radiation encountered in PET and other applications, but also has a short decay time and is not hygroscopic. In the context of PET, the solid state construction of the HgI$_2$ photodetector permits it to be miniaturized for use with narrower scintillators, greatly enhancing image resolution. The scintillator itself then becomes the limiting factor from the standpoint of size.

The continuous semi-transparent contacts of the present invention enable a uniform potential difference to be established between the first and second surfaces, producing a consistent and reproducible response to incoming light. Palladium films do not react with the crystal and therefore do not deteriorate over time.

The HgI$_2$ detector of the present invention, although disclosed herein primarily with respect to scintillation detection, is also uniquely suited to other purposes requiring a light detector of high sensitivity within the photoresponsive range of HgI$_2$. For example, a large number of miniaturized photodetectors of this type could be used within an optical telescope to distinguish light patterns which cannot be seen with the human eye. A special purpose television camera could also be constructed using HgI$_2$ photodetectors. In such cases, the individual detectors might be approximately 25 micrometers square and placed side-by-side to produce a picture of high resolution. HgI$_2$ photodetectors could also measure light produced by fluorescent dyes used to label cells in biological studies.

BRIEF DESCRIPTION OF THE DRAWINGS

The above and other features of the invention may be more fully understood from the following detailed description, taken together with the accompanying drawings, wherein similar reference characters refer to similar elements throughout and in which.

DESCRIPTION OF THE PREFERRED EMBODIMENTS

Figure 1:
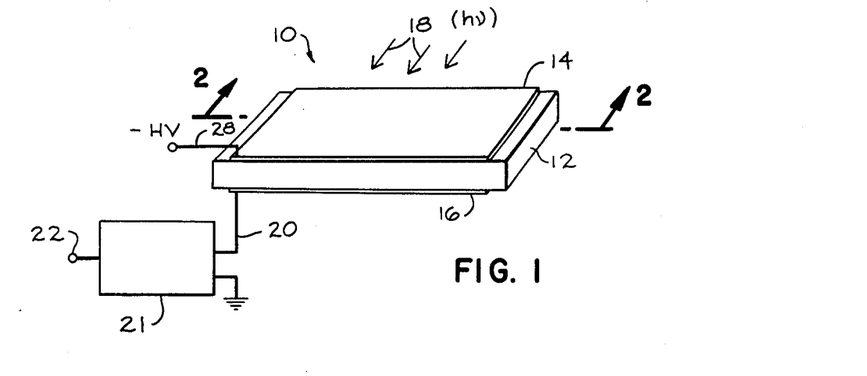
FIG. 1 is a somewhat diagrammatic perspective view of a light detecting apparatus constructed in accordance with the present invention.
Figure 4:
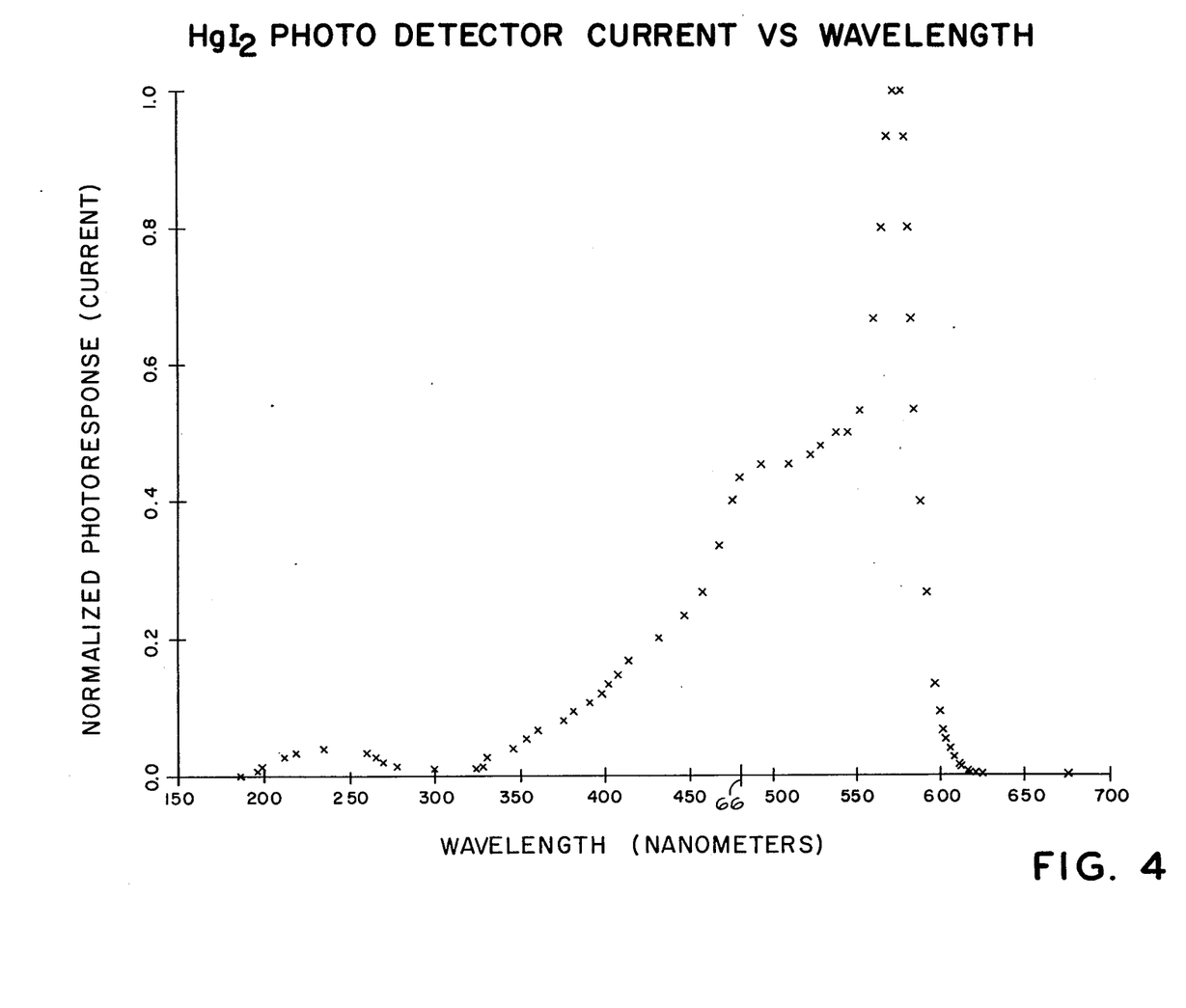
FIG. 4 is a graphical representation of the normalized response of the HgI$_2$ photodetector of the present invention.

Referring now to the drawings, FIG. 1 illustrates a light detector 10 constructed in accordance with the present invention. The light detector 10 comprises a body 12 of mercuric iodide (HgI$_2$) confined between a substantially transparent upper contact film 14 and a lower contact film 16. Light 18 incident on the detector 10 passes through the upper contact 14 and is absorbed by the body 12 of HgI$_2$ to produce electron-hole pairs therein. The electrons and holes are collected by a potential difference applied between the upper contact 14 and the lower contact 16 to produce a current signal along a lead 20. The signal is passed through a low noise pulsed-light feedback preamplifier 21 to an output terminal 22. The experimentally determined response of the output signal to light entering the detector 10 is shown in FIG. 4, which demonstrates a favorable photoresponse at room temperature to light in the wavelength range of 350 to 600 nanometers.

Figure 2:
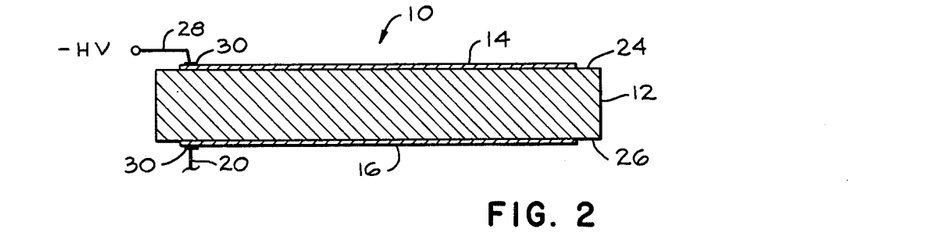
FIG. 2 is a vertical sectional view taken along the line 2—2 of FIG. 1.

FIG. 2 is a sectional view of the light detector 10 which clearly shows the body 12 and the two contact films. The body 12 may range in thickness from a small fraction of a millimeter (mm) to a few millimeters, and is preferably on the order of 0.5 mm thick. The thickness of the light detector is chosen to optimize its operation from the standpoint of self-capacitance and electron collection. The upper contact film or window 14 is substantially transparent and may comprise a palladium film on the order of 50 to 200 angstroms thick. The conductivity of the film will then be great enough that any voltage drop along it will be negligible in comparison with the drop across the body 10. Palladium is one of a very few metals which does not react with HgI$_2$, and highly advantageous results have been obtained with a film 100 angstroms thick. The lower contact film 16 may similarly be made of palladium. However, the lower film can be somewhat thicker than the film 14 because it need not be transparent. In some cases it may be desirable to use a material other than palladium as the contacts 14 and 16. The most promising possible substitutes are believed to be germanium, tin oxide, indium oxide and indium tin oxide.

The body 12 of HgI$_2$ is preferably substantially monocrystalline and extends from an upper surface 24 adjacent to the contact 14 to a lower surface 26 adjacent to the contact 16. The upper contact 14 coincides generally with the active area of the detector. The upper and lower surfaces are preferably smooth and parallel, and the contact films 14 and 16 are substantially continuous therealong. A negative high voltage potential ($-HV$) is applied to the contact 14 through a lead wire 28, and the lower contact 16 is coupled to ground through the lead wire 20 and the amplifier 21 of FIG. 1. The lead wires 28 and 20 may be very thin wires connected to the contact films by carbon-containing paints or adhesives, or other suitable means, as shown at 30 in FIG. 2. The lead wires and the contact films thus apply a substantially uniform voltage between the surfaces 24 and 26 of the body 12, creating a uniform potential difference across the entire detector volume. The photoresponse of the detector 10 is uniform over the active area, producing a consistent and repeatable current signal in the line 20. It will be understood that the uniformity of potential difference referred to herein relates to the potential difference between the portions of the surfaces 24 and 26 which are covered by the contact films 14 and 16, respectively, at various locations over the active area of the detector. The voltage within the body 12 will, of course, vary as a function of depth.

It has been found that the maximum size of the device of FIG. 1 is limited as a practical matter by the requirement that the potential difference and other operating parameters of the detector be uniform over its active area. Thus, the device of FIG. 1 is generally limited to a maximum active area of between 1 and 2 square centimeters (cm$^2$), in part because of the difficulty of obtaining a substantially monocrystalline sample of HgI$_2$ of greater area. The detector 10 can, of course, be much smaller than this maximum. For example, it may be desirable to produce devices having active areas as small as 25 micrometers square for use in specialized optical telescopes, television cameras and the like. In this context, a large number of detectors can be used to sense light on a highly localized level and provide accurate positional information or enhanced image resolution.

Because the body 12 of HgI$_2$ is generally opaque for wavelengths shorter than approximately 570 nm, light passing through the contact 14 to the active area of the upper surface 24 is absorbed very close to that surface. The absorbed light produces electron-hole pairs which are acted upon by the electric field within the body 12. The holes are drawn toward the negative potential of the transparent contact 14 at the upper surface 24. They reach the contact almost immediately and are collected before they have a chance to recombine. The electrons are drawn downwardly to the contact 16 and are able to survive the transport due to the excellent electron collection characteristics of HgI$_2$. That is, electrons are very mobile with respect to holes in HgI$_2$ and also have long lifetimes in the material. As a result, virtually all of the generated charge carriers reach the contacts, completing the current signal. The amplitude of the current pulse is a measure of the intensity of the incident light 18.

The detector 10 also has a very low noise level, due to the wide band gap and very high resistance of HgI$_2$. In fact, the leakage current through the detector is on the order of $10^{-12}$ amperes at working conditions. The signal strength therefore need not be very high to be above the level of noise.

In operation, the light detector 10 is directed in such a manner that light 18 is incident on the transparent upper contact 14 for passage into the body 12 of HgI$_2$. The light causes a current signal to flow along the line 20, which signal is amplified to produce a suitable output at the terminal 22.

Figure 3:
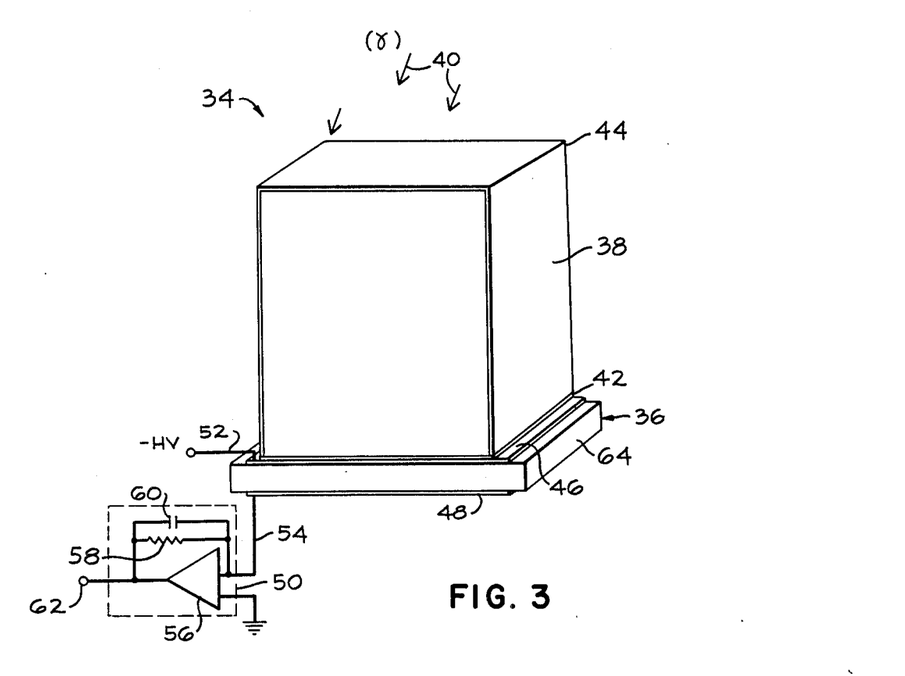
FIG. 3 is a somewhat diagrammatic perspective view of a scintillation detector constructed according to the present invention.

Referring now to FIG. 3, there is illustrated a second embodiment of the present invention, generally designated 34. The embodiment 34 is a scintillation detector comprising a photodetector 36 similar to that described in relation to FIG. 1 and a scintillator 38 optically coupled to the active area of the photodetector. The scintillator 38 comprises a body of scintillator material which may be given any desired shape for absorption of ionizing radiation 40. The ionizing radiation may be gamma, neutron, or charged particle radiation which interacts with the material of the scintillator 38 to produce scintillation. The scintillator 38 will therefore typically be a material such as NaI(Tl), CsI(Tl), LiI(Eu), BGO or CdWO$_4$, but can also be a suitable gaseous or liquid scintillator. In the detection of gamma radiation, BGO is particularly useful as the scintillator material due to its short decay time, nonhygroscopic properties and good absorption coefficient for gamma radiation. Although the precise dimensions of the scintillator 38 will depend upon the application and upon the scintillator material used, it typically will be several times as thick as the photodetector 36 and will be the limiting factor in downsizing the scintillation detector. For simplicity, the following discussion deals specifically with a scintillation detector 34 for use in detecting gamma radiation of the type emitted in positron emission tomography (PET), and the scintillator 38 will be a homogeneous body of BGO.

The scintillator 38 is joined to the photodetector 36 along the active area of the photodetector by a suitable optical grease or other coupling agent 42. All other surfaces of the scintillator are preferably covered with a coating 44 to promote internal reflection of light within the scintillator. A variety of paints or other reflective coatings are suitable for use as the coating 44, a specific example of which is commercially available reflective paint containing titanium and magnesium oxide. The coating 44 is thus easily penetrated by gamma radiation 40 incident on the scintillator, while providing almost complete internal reflection of light generated within the material 38 by scintillation. Thus, the generated light can be reflected internally within the scintillator until it reaches the lower surface thereof for passage to the photodetector 36. The optical coupling agent 42 is preferably chosen to have an index of refraction which optimizes the transmission of light from the scintillator to the photodetector.

As discussed, the photodetector 36 can be substantially the same as the photodetector 10 of FIG. 1, having a transparent upper contact portion 46, a lower contact portion 48 and a preamplifier 50. The contact 46 is connected to a negative high voltage source through a lead 52, and the lower contact 48 is connected to the grounded preamplifier 50 by a lead 54. The preamplifier 50 generally includes very low noise amplification 56 and has a parallel resistance 58 and a parallel capacitance 60 to close the feedback loop. A preferred embodiment may use a pulsed-light feedback preamplifier of the type disclosed in Iwanczyk et al., supra, and shown in FIG. 2.

In operation, the scintillation detector is exposed to ionizing radiation 40 in a manner causing the radiation to enter the scintillator 38 and interact with it to produce light of a characteristic scintillation spectrum. The light is contained within the scintillator until it reaches the lower surface, either by direct transmission or internal reflection. It is then transmitted by the optical coupling agent 42 and the substantially transparent contact 46 to a body 64 of HgI$_2$. The HgI$_2$ absorbs the light at a location near its upper surface to produce pairs of charge carriers which are acted upon by the potential difference between the contact films. A net flow of electrons is thus produced along the lead 54 to the preamplifier 50, where it is transformed to a usable output signal at a terminal 62. The flow of electrons corresponds to a positive current along the lead 54 toward the lower contact 48.

In PET, the ionizing radiation 40 is annihilation radiation having an energy of 511 keV. This radiation interacts at various locations within the bulk of the scintillator 38 to produce light having a wavelength of approximately 480 nm, well within the photodetecting spectrum of HgI$_2$.

Figure 5:
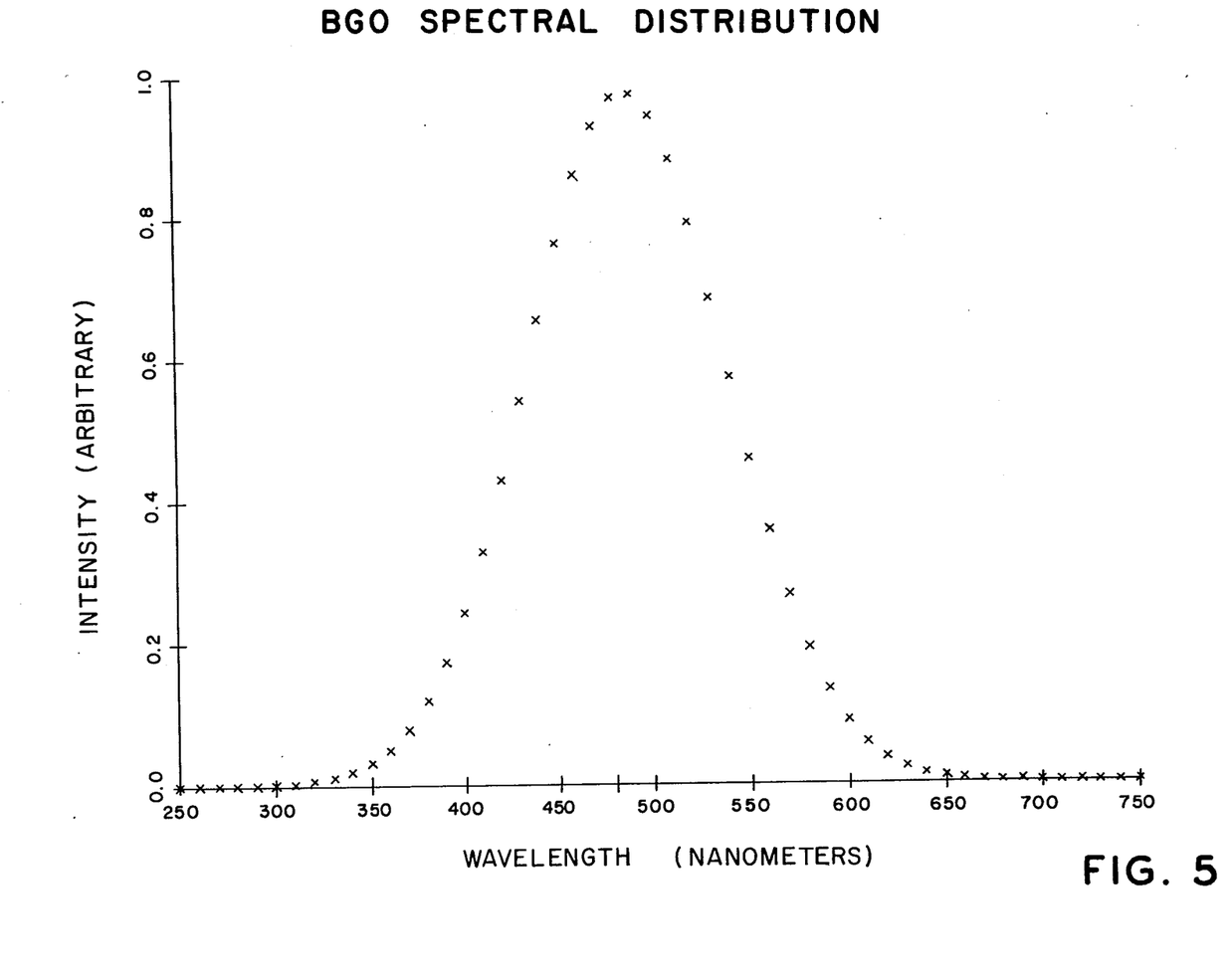
FIG. 5 is a graphical representation of the scintillation spectrum of BGO.
Figure 6:
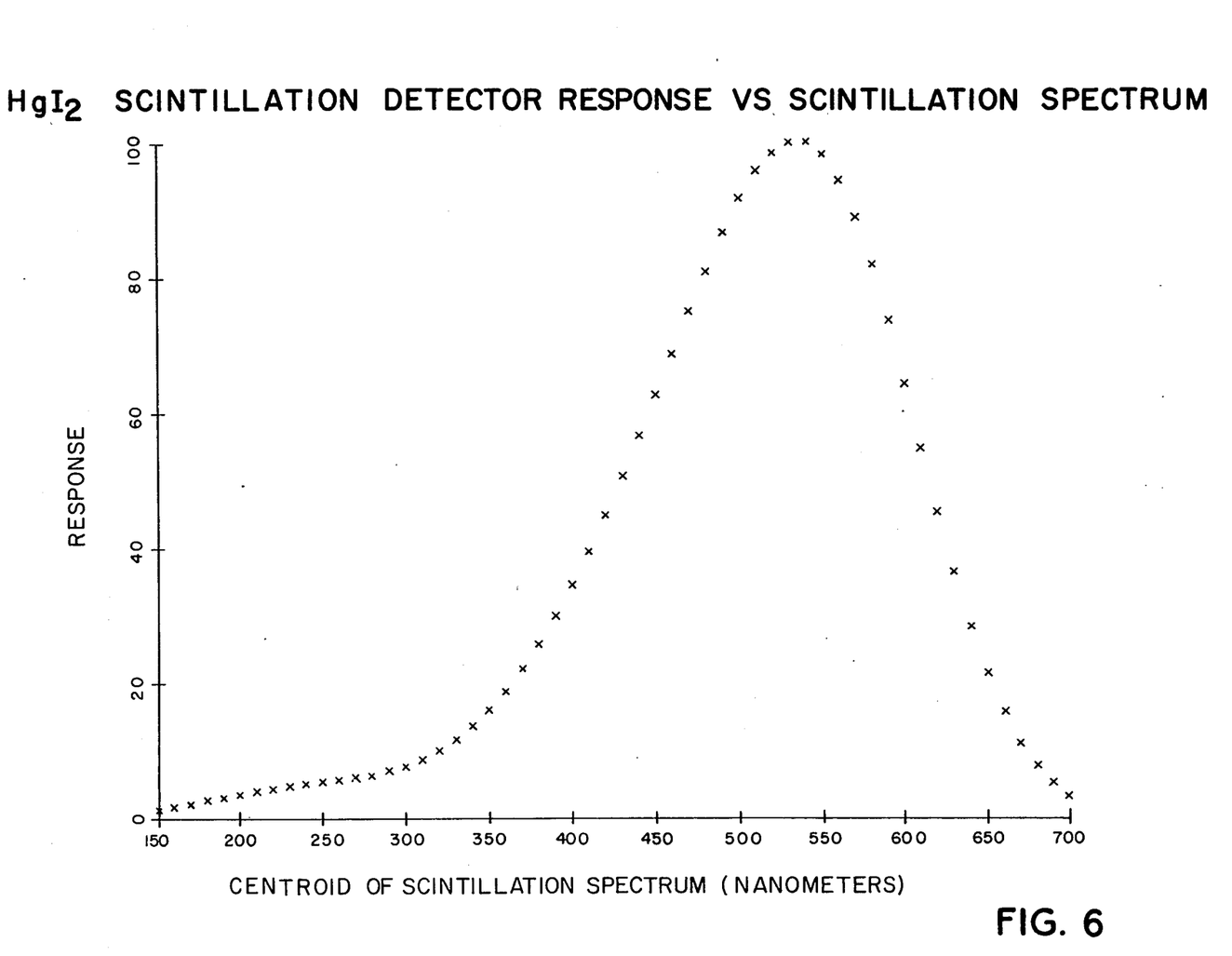
FIG. 6 is a graphical representation of the response of the HgI$_2$ scintillation detector of the present invention as a function of the centroid of the scintillator spectrum.

The compatibility of the BGO scintillator 38 and the HgI$_2$ photodetector 36 for detection of 511 keV gamma radiation 40 can be seen in relation to FIGS. 4, 5 and 6, which are graphs plotted with an arbitrary vertical scale. It is well known that BGO is responsive to ionizing radiation in a range which includes 511 keV. The scintillation light output of BGO is shown in FIG. 5, which is derived from published data. As seen in FIG. 5, the centroid of the BGO light spectrum is approximately 480 nm. FIG. 4 shows the empirical photoresponse of HgI$_2$ as a function of the wavelength of incident light. The wavelength of 480 nm, shown at 66 in FIG. 4, is well within the photoresponsive range of HgI$_2$. The HgI$_2$ photodetector of the present invention is ideal for detecting the output of BGO, which is advantageous in many respects but has a very low light output relative to other scintillators. The BGO output is measurable with the HgI$_2$ detector of the present invention due to its high sensitivity in the applicable range and the high signal-to-noise ratio of its output. The low noise preamplifier permits the signal from the photodetector to be converted to a useable form.

FIG. 6 illustrates the photoresponse of the HgI$_2$ detectors 10 and 36 as a function of the centroid of the spectrum of light applied thereto. This curve is calculated from the information of FIGS. 4 and 5, assuming that the output of the scintillation material or other light source has a spectrum shaped like that of BGO.

Figure 7:
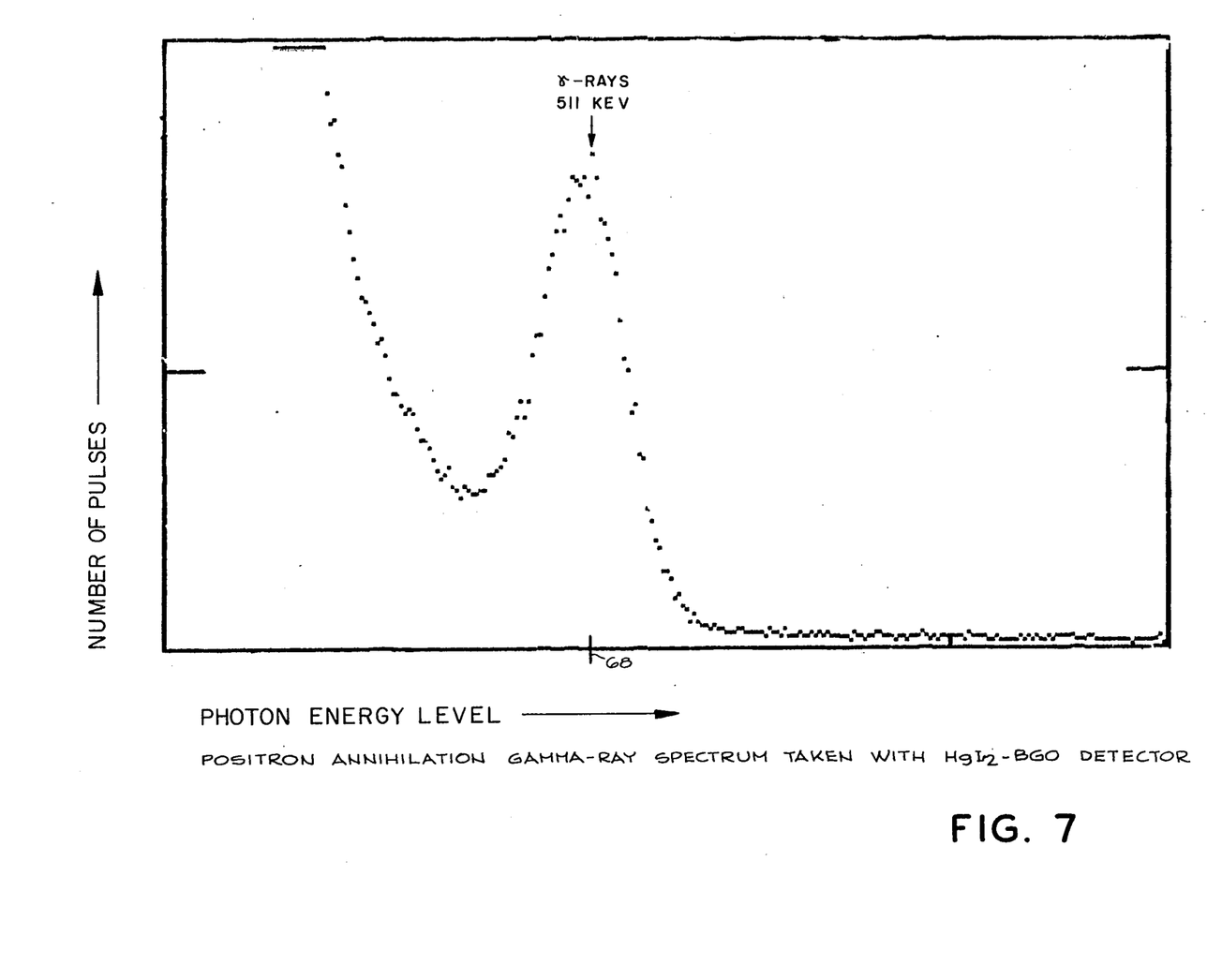
FIG. 7 is a positron annihilation gamma ray spectrum taken with the HgI$_2$/BGO detector of the present invention.

FIG. 7 illustrates the output spectrum of the scintillation detector 34 when it is used to detect gamma rays produced by positron annihilation. The initial downwardly sloping portion is due to a variety of effects, including Compton scattering, and the peak at 68 corresponds to the full gamma ray energy detected. It has been found that the HgI$_2$-BGO scintillation detector constructed as described herein has a resolution of approximately 24 percent at 511 keV, without optimizing various parameters such as the reflectivity of the scintillator coating, the coupling between the scintillator and the photodetector, and the transparency of the electrode. A similarly constructed detector in which CsI(Tl) is substituted for the scintillator material has yielded a resolution of 19%. These resolutions were arrived at by measuring the full width of the peak 68 at the half maximum thereof and dividing by the energy level at the location 68. They compare to an energy resolution of between 15 and 17 percent for scintillation detectors using commercially available PM tubes at 511 keV. It is believed that the inherently higher quantum efficiency of the solid state HgI$_2$ photodetector of the present invention should make it possible to obtain energy resolutions much lower than those obtainable with PM tubes, when the relevant parameters are optimized.

From the above, it can be seen that there has been provided a photodetector of high sensitivity and high signal-to-noise ratio for wavelengths of 350 to 600 nm. Although potentially useful in a number of applications, the photodetector of the present invention is particularly advantageous when combined with scintillators for detecting gamma rays, neutrons, alpha particles and other forms of radiation.

What is claimed is:

1. Apparatus for detecting radiation comprising:
   a scintillator;

a body of mercuric iodide defining a first surface for exposure to light and a second surface spaced from the first surface;

means for optically coupling the scintillator to the first surface;

means for producing an electrical potential difference between the first and second surfaces; and means for measuring current passed through the body of mercuric iodide in response to light produced within the scintillator.

2. The apparatus recited in claim 1 wherein the body of mercuric iodide is substantially monocrystalline.

3. The apparatus recited in claim 1 wherein the scintillator is BGO.

4. The apparatus recited in claim 1 wherein the scintillator is CsI(TI).

5. The apparatus recited in claim 1 wherein the scintillator defines an exterior surface having a primary portion for receiving incident radiation and a secondary portion coupled to the first surface of the mercuric iodide body, the primary portion having a coating which is substantially transparent to radiation incident on the scintillator and is substantially reflective of light produced by the scintillator.

6. The apparatus recited in claim 1 wherein the potential-producing means is constructed and arranged to produce a substantially uniform electrical potential difference between the first and second surfaces and to admit light to the first surface.

7. The apparatus recited in claim 6 wherein the potential-producing means comprises a substantially transparent conductive layer at the first surface, a second conductive layer at the second surface, means for applying a first potential to the transparent conductive layer, and means for coupling the second conductive layer to a second potential which is positive with respect to the first potential.

8. The apparatus recited in claim 7 wherein the substantially transparent conductive layer is a palladium film no more than 200 angstroms thick.

9. The apparatus recited in claim 8 wherein the palladium film is approximately 100 angstroms thick.

10. The apparatus recited in claim 7 wherein the measuring means includes means for amplifying the current passed between the first and second surfaces.

11. The apparatus recited in claim 10 wherein the amplifying means is connected between the second conductive layer and ground.

12. The apparatus recited in claim 11 wherein the amplifying means includes a low noise preamplifier system.

13. The apparatus recited in claim 12 wherein the preamplifier is a pulsed-light feedback preamplifier.

14. A method of detecting radiation comprising:

exposing a scintillator to incident radiation to generate a light output;

applying an electrical potential across a body of mercuric iodide;

directing the light output of the scintillator onto the body to generate an electrical signal; and sensing the electrical signal as a measure of the incident radiation.

15. The method recited in claim 14 wherein the body of mercuric iodide is substantially monocrystalline and defines a first surface for exposure to light and a second surface spaced from the first surface, and the potential-applying step comprises producing a substantially uniform electrical potential difference between the first and second surfaces.

* * * * *